(12) United States Patent
Chin et al.

(10) Patent No.: US 7,283,081 B2
(45) Date of Patent: Oct. 16, 2007

(54) APPLICATION CIRCUIT AND METHOD FOR SHAPING NOISES

(75) Inventors: Chieh-Chuan Chin, Taichung (TW); Bing-I Chang, Tainan (TW); Wen-Chi Wang, Yunlin (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/407,187

(22) Filed: Apr. 20, 2006

(65) Prior Publication Data

US 2007/0024483 A1    Feb. 1, 2007

(30) Foreign Application Priority Data

Apr. 20, 2005    (TW) ............................... 94112625 A

(51) Int. Cl.
*H03M 1/12*    (2006.01)
(52) U.S. Cl. ................ 341/155; 341/144; 341/145; 341/118
(58) Field of Classification Search ............... 341/144, 341/145, 143, 118, 155
See application file for complete search history.

(56) References Cited

U.S. PATENT DOCUMENTS

| | | | |
|---|---|---|---|
| 5,598,158 A * | 1/1997 | Linz ........................... 341/143 |
| 5,977,899 A * | 11/1999 | Adams ........................ 341/145 |
| 6,057,791 A * | 5/2000 | Knapp ........................ 341/122 |
| 6,218,977 B1 | 4/2001 | Friend et al. |
| 6,266,002 B1 | 7/2001 | Gong et al. |
| 6,271,781 B1 * | 8/2001 | Pellon ........................ 341/143 |
| 6,304,608 B1 | 10/2001 | Chen et al. |
| 6,366,228 B2 | 4/2002 | Nagata |
| 6,469,648 B2 | 10/2002 | Nakao et al. |
| 6,518,899 B2 * | 2/2003 | Yu ............................ 341/118 |
| 6,611,221 B1 * | 8/2003 | Soundarapandian et al. ...................... 341/143 |
| 6,642,873 B1 | 11/2003 | Kuang |
| 6,744,392 B2 * | 6/2004 | Melanson .................... 341/143 |
| 2003/0197633 A1 * | 10/2003 | Adams et al. ............... 341/144 |

OTHER PUBLICATIONS

R. Schreier, et al., "Noise-shaped multibit D/A convertor employing unit elements." Electronics Letters Sep. 28, 1995, vol. 31.
Haiqing Lin, et al., "Multi-Bit DAC with Noise-Shaped Element Mismatch." 1996 IEEE, May 12-15 1996.
L. Richard Carley, "A Noise-Shaping Coder Topology for 15+ Bit Converters." 1989 IEEE, Apr. 1989.
Rex T. Baird, et al., "Linearity Enhancement of Multibit ΔΣ A/D and D/A Converters Using Data Weighted Averaging." 1995 IEEE, Dec. 1995.

* cited by examiner

*Primary Examiner*—Jean Bruner Jeanglaude
(74) *Attorney, Agent, or Firm*—Harness, Dickey & Pierce, P.L.C.

(57) ABSTRACT

An application circuit for shaping noises and method thereof involve an analog-to-digital converter which converts a first analog signal into an n-bit digital signal for an encoder to generate a p-bit digital signal. Then a control circuit generates a plurality of control signals based on the p-bit digital signal, wherein p is two to the power of n minus one, and n is an integer greater than one. Each of the $(2^n-1)$ unit elements with element mismatch in an internal n-bit digital-to-analog converter executes the digital to analog conversion in response to the corresponding control signal, thereby generating a second analog signal, and an adder outputs the first analog signal based on the second analog signal and a third analog signal.

18 Claims, 7 Drawing Sheets

APPLICATION CIRCUIT AND METHOD FOR SHAPING NOISES

CROSS-REFERENCE TO RELATED APPLICATIONS

This non-provisional application claims priority under 35 U.S.C. § 119(a) on Patent Application No(s). 094112625 filed in Taiwan, R.O.C. on Apr. 20, 2005, the entire contents of which are hereby incorporated by reference.

BACKGROUND

1. Field of Invention

The invention relates to a noise shaping circuit and, in particular, to a circuit and method for shaping noises, which are applied to an analog-to-digital converting circuit.

2. Related Art

In an analog-to-digital converting circuit, a feedback loop is often formed by an analog-to-digital converter (ADC). However, multi-bit analog-to-digital converter may cause a nonlinear effect due to element mismatch. Moreover, the circuit is equivalent to one adding a noise source to the signal input terminal of the analog-to-digital converting circuit if the imperfect linear transformation are not trimmed or the noises caused by that are not shaped. Therefore, the performance of the circuit is reduced. Herein, related techniques and research can be found in U.S. Pat. Nos. 6,642,873, 6,469,648, 6,304,608, 6,266,002, 6,366,228, and 6,218,977. Please also refer to R. Schreier and B. Zhang, "Noise-Shaped Multibit D/A Convertor Employing Unit Elements," Electronics letters, Vol. 31, No. 20, P1712-P1713, 28$^{th}$ Sep. 1995; H. Lin, J. Barreiro da Silva, B. Zhang and R. Schreier, "Multi-Bit DAC with Noise-Shaped Element Mismatch," Connecting the World, 1996 IEEE International Symposium, Vol. 1, P235-P238, May 1996; L. Richard Carley, "A Noise-Shaping Coder Topology for 15+ Bit Converters," IEEE Journal of Solid-State Circuits, Vol. 24, No. 2, P267-P273, Apr. 1989; and R. T. Baird and T. S. Fiez, "Linearity Enhancement of Multibit ΔΣ A/D and D/A Converters Using Data Weighted Averaging," IEEE Transactions on Circuits and Systems-II: Analog and Digital Signal Processing, Vol. 42, No. 12, P753-P762, Dec. 1995.

SUMMARY

Therefore, an object of the invention is to provide an application circuit and the method with the noise shaping function, to perform noise shaping toward the nonlinear effects produced by the digital-to-analog converter (DAC) in a circuit.

Another object of the invention is to provide an analog-to-digital converting method for performing the noise shaping toward the nonlinear effects produced during digital to analog conversions.

Yet another object of the invention is to provide a noise shaping circuit, applied to an analog-to-digital converting circuit for performing the noise shaping toward the nonlinear effects produced by the digital-to-analog converter in a circuit.

To achieve the above objects, the disclosed analog-to-digital converting circuit with the noise shaping function includes: an analog-to-digital converter, an encoder, a control circuit, and an analog-to-digital converting unit. Here, the analog-to-digital converter converts an analog signal into an n-bit digital signal, which is then operated by the encoder to generate a corresponding p-bit digital signal, where n and p are integers greater than 1. The p-bit digital signal is acted by the control circuit to produce a plurality of corresponding control signals. The analog-to-digital converting unit generates the corresponding analog signals according to the control signals.

To achieve the above objects, a noise shaping method is disclosed for generating an n-bit digital signal according to a first analog signal and for performing noise shaping. The method includes the steps of: generating an n-bit digital signal according to a first analog signal and a second analog signal; encoding the n-bit digital signal to produce a p-bit digital signal; generating at least one digital control signal according to the p-bit digital signal; and generating the second analog signal according to the digital control signal. Here n is an integer greater than one, and p is an integer greater than p.

To achieve the above objects, the invention discloses a noise shaping circuit, applied to an analog-to-digital converting circuit, for performing noise shaping when the analog-to-digital converting circuit generates an n-bit digital signal according to the first and second analog signals. The noise shaping circuit includes: an encoder for generating a p-bit digital signal according to the n-bit digital signal; a control circuit for generating at least one control signal according to the p-bit digital signal; and a digital-to-analog converting unit for generating the second analog signal according to the control signal. Here n is an integer greater than one, and p is an integer greater than P.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
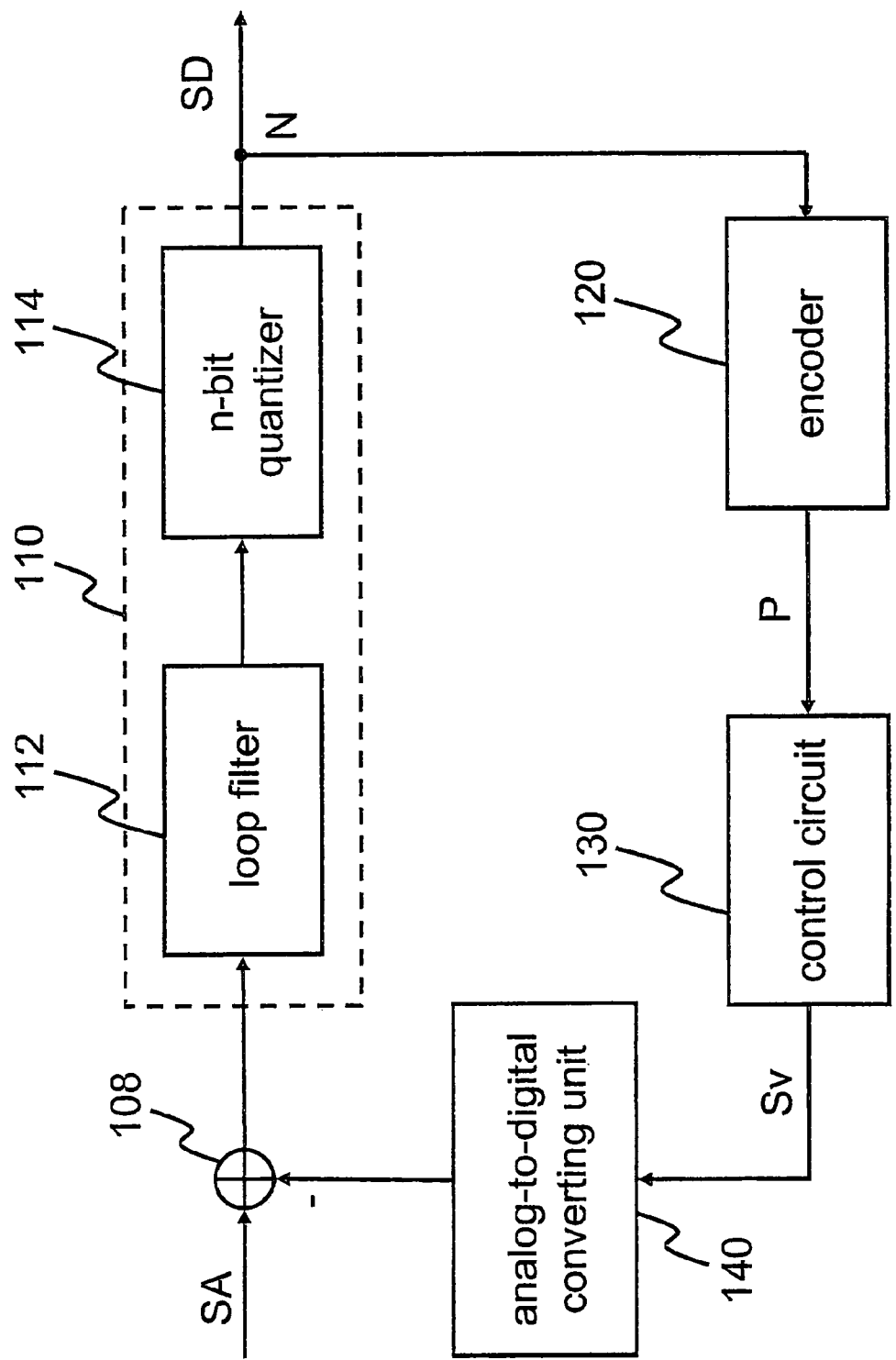
FIG. 1 shows a system structure of the analog-to-digital converting circuit according to an embodiment of the invention.

With reference to FIG. 1, the analog-to-digital converting circuit in an embodiment of the invention includes: an analog-to-digital converter 110, an encoder 120, a control circuit 130, an analog-to-digital converting unit 140, and an adder 108, where n is an integer greater than 1.

The analog-to-digital converter 110 converts an analog signal into an n-bit quantized digital signal N, i.e. the output digital signal SD. In this embodiment, the analog-to-digital converter 110 can be an n-bit sigma-delta modulator (Σ-Δ modulator), including a loop filter 112 and an n-bit quantizer 114. Here the loop filter 112 generates a preprocessing signal according to the output result of the adder 108. The preprocessing signal is quantized by the n-bit quantizer 114 to output the n-bit quantized digital signal N.

The encoder 120 is coupled to the analog-to-digital converter 110 to generate according to the n-bit quantized digital signal N a corresponding p-bit digital signal P, where p is an integer greater than n. In this embodiment p is 2 to the power of n minus one.

Moreover, the control circuit 130 generates at least one control signal Sv according to the p-bit digital signal P and outputs it to the analog-to-digital converting unit 140. In this embodiment, the analog-to-digital converting unit 140 can be an internal n-bit digital-to-analog converter, including ($2^n$−1) unit elements with element mismatch. These unit elements can provide an analog signal corresponding to the n-bit quantized digital signal N according to the control signal Sv output by the control signal 130.

In this embodiment, the control circuit 130 includes: a vector quantizer and a feedback circuit. The feedback circuit is comprised of a filter circuit and a digital sorting circuit. The vector quantizer can vectorize the p-bit digital signal P. The filter circuit can enhance or improve the properties of the input vectorized p-bit digital signal P. The digital sorting circuit can find the minimum of the vector signal after the action of the filter circuit. Besides, the vector quantizer outputs the control signal Sv according to the magnitude of the signal fed back from the filter circuit and the digital sorting circuit and the p-bit digital signal P input by the encoder 120. Here the filter circuit can be a finite-pulse response filter or an infinite-pulse response filter.

In this embodiment, the analog-to-digital converting unit 140 contains a switch circuit for coupling the ($2^n$−1) unit elements to a reference level or an analog ground according to the control signal Sv. The control signal Sv output from the control circuit 130 is used to provide an analog signal corresponding to the n-bit quantized digital signal N. For example, when a particular control signal corresponds to the logic 1, the unit element corresponding to the logic 1 control signal is coupled to the reference level. When a control signal corresponds to the logic 0, the unit element corresponding to the logic 0 is coupled to the analog ground.

Since the definition of noises in the analog-to-digital converter is defined as the difference between the outputs of the analog-to-digital converter with element mismatch and the ideal analog-to-digital converter. The internal analog-to-digital converter acts according to the control signal generated by the control circuit. Therefore, as long as a filter circuit with an appropriate transfer function is selected, the noises caused by the element mismatch of the analog-to-digital converter can be shaped.

Figure 2:
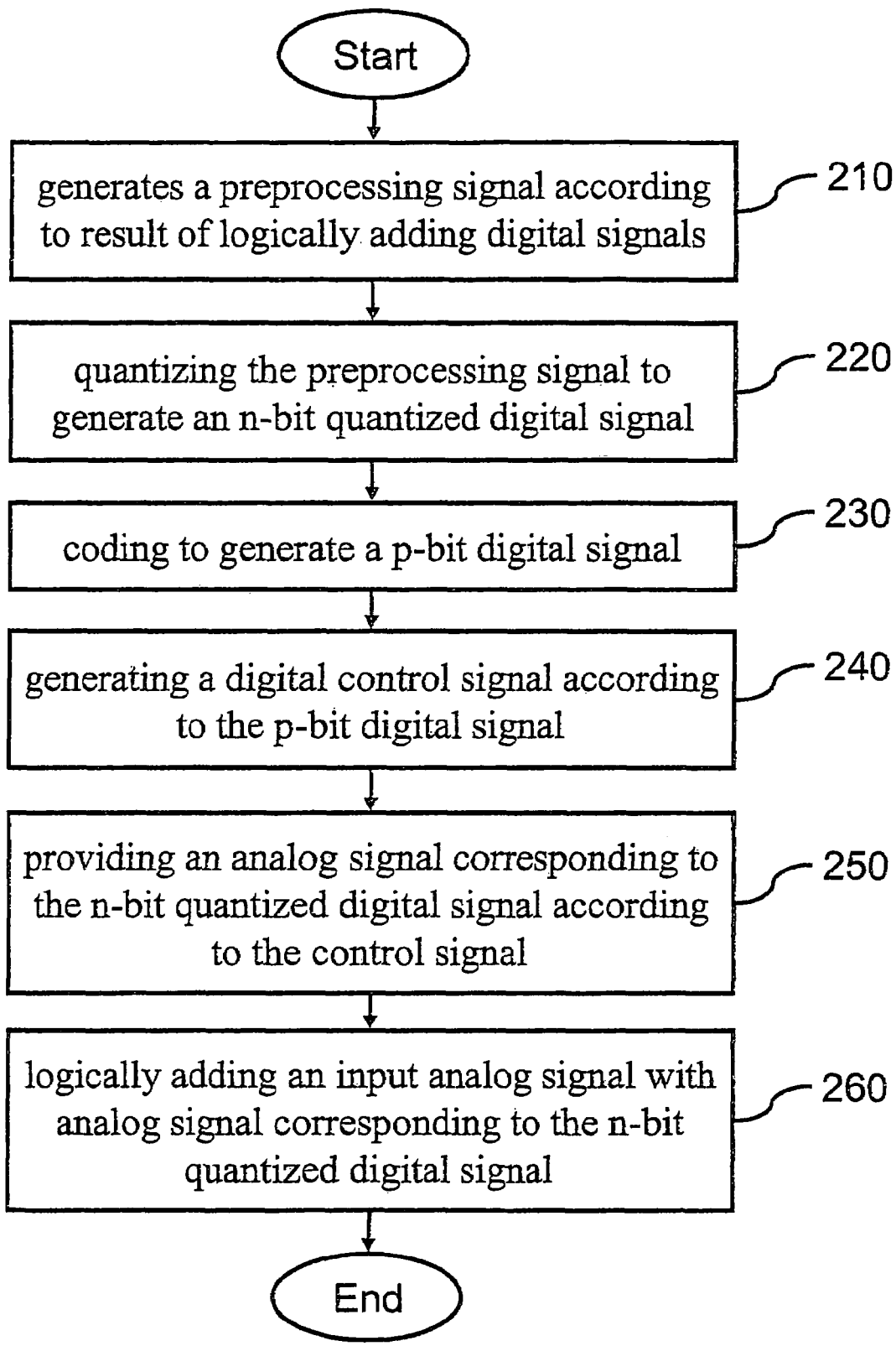
FIG. 2 is a flowchart of the noise shaping method according to an embodiment of the invention.

In the following, we explain the operating principle of the disclosed noise shaping circuit. As shown in FIGS. 1 and 2, the loop filter 112 in the analog-to-digital converter 110 receives the output of the adder 108 and generates a preprocessing signal accordingly (step 210). Afterwards, the n-bit quantizer 114 quantizes the preprocessing signal and generates an n-bit quantized digital signal N (step 220). The n-bit quantized digital signal N is received by the encoder 120 and coded into a p-bit digital signal P (step 230), where p is two to the power of n minus one. In this embodiment, the encoder is a thermal encoder. Here we use n=3 and p=8 as an example to explain how the encoder 120 encode the signal. This is illustrated in Table 1.

TABLE 1

| N | P |
|---|---|
| 000 | 0000000 |
| 001 | 1000000 |
| 010 | 1100000 |
| 011 | 1110000 |
| 100 | 1111000 |
| 101 | 1111100 |
| 110 | 1111110 |
| 111 | 1111111 |

Figure 3:
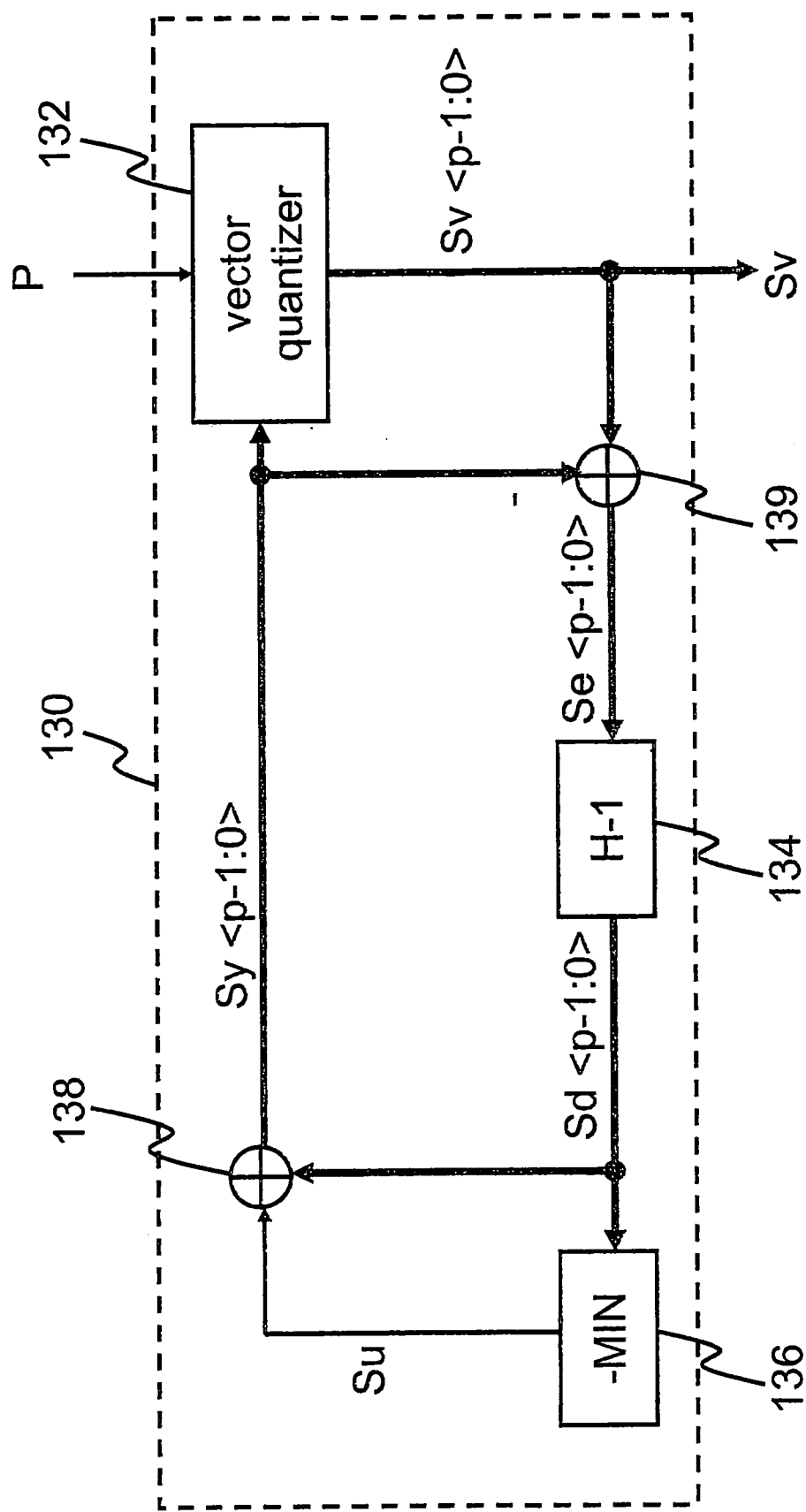
FIG. 3 shows an embodiment of the system structure of the control circuit in FIG. 1.

The p-bit digital signal P encoded by the encoder 120 is output to the control circuit 130, which generates a digital control signal Sv accordingly (step 240). In this embodiment, the control circuit 130 includes a vector quantizer 132 and a feedback circuit. The feedback circuit has a filter circuit 134, a digital sorting circuit 136, and adders 138, 139, as illustrated in FIG. 3. As shown in the drawing, the vector quantizer 132 is used to vectorize the input p-bit digital signal P to form a vector signal. Afterwards, the filter circuit 134 enhances or improves the properties of the input vector signal. The digital sorting circuit 136 then finds the minimum MIN of the input vector signal. In other words, the adder 139 generates a first output signal Se<p−1:0> according to the control signal Sv<p−1:0> and the feedback signal Sy<p−1:0> generated by the vector quantizer. The filter circuit 134 filters the received first output signal Se<p−1:0> to generate a second output signal Sd<p−1:0>. The digital sorting circuit 136 acquires the minimum MIN of the second output signal Sd<p−1:0> and outputs a third output signal Su accordingly. Finally, the adder 138 logically adds the second output signal Sd<p−1:0> and the third output signal Su to acquire the feedback signal Sy<p−1:0>.

In FIG. 3, the thick line represents the transmission path of the vector signal and the thin line represents the transmission path of a single signal. Moreover, Sv<p−1:0> is the output of the vector quantizer 132 (i.e., the control signal). Se<p−1:0> is the input of the filter circuit 134 (i.e., the first output signal). Sd<p−1:0> is the output of the filter circuit 134 (i.e., the second output signal). Su is the negative minimum of Sd<p−1:0> (i.e., the third output signal). Sy<p−1:0> is the value of Sd<p−1:0> plus Su (i.e., the feedback signal). Moreover, H is the transfer function of the filter circuit 134.

In this embodiment, the vector quantizer 132 determines its output value according to the magnitude of the feedback signal Sy<p−1:0> and the number of logic 1's in the p-bit digital signal P. When the p-bit digital signal P does not contain the logic 1, the output of the control signal Sv<p−1:0> is logic 0. When the p-bit digital signal P contains one logic 1 and suppose the maximum of the feedback signal Sy<p−1:0> and 0≦k≦p−1, then Sv <k> in Sv<p−1:0> is logic 1 while Sv<i> is logic 0" with i≠k. Besides, when the p-bit digital signal P has two logic 1's and suppose the maximal two of the feedback signal Sy<p−1:0> are Sy<k> and Sy<l> with 0≦k and l≦−1, then Sv<k> and Sv<l> in the control signal Sv<p−1:0> are logic 1's and Sv<i> is logic 0 with i≠k 1, and so on. Moreover, when more than two of the Sy are equal, then the one with a larger value in the bracket <> is output as logic 1 first.

The error of a fixed analog-to-digital converting unit 140 (which can be an internal n-bit analog-to-digital converter here) can be shaped by the transfer function of the filter circuit 134. Therefore, choosing the transfer function H of the filter circuit 134 appropriately can make the whole system convergent. That is, the system can perform noise shaping on the error of the analog-to-digital converting unit 140. This reduces the error of the analog-to-digital converting unit 140 due to the element mismatch.

In the current embodiment, the filter circuit 134 can be an infinite impulse response (IIR) filter or a finite impulse response (FIR) filter. In high frequencies, the FIR filter amplifies the noises in comparison with the IIR filter. Therefore, more bits are needed to accommodate a larger data range, preventing the data overflow problem from happening in the feedback path of the filter circuit 134.

Figure 4:
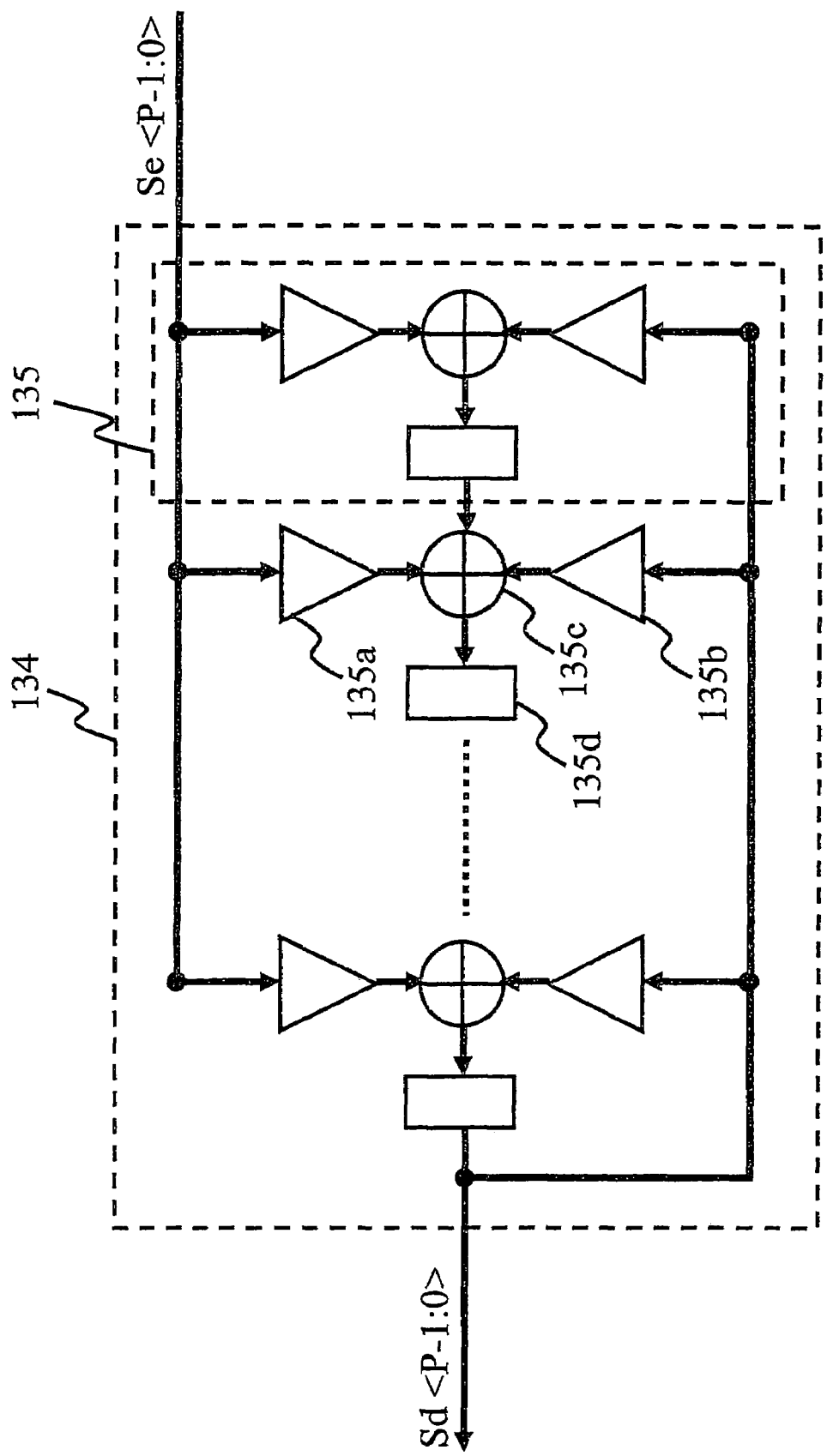
FIG. 4 shows an embodiment of the system structure of the filter circuit in FIG. 3.

With reference to FIG. 4, the IIR filter in this embodiment of the filter circuit has m sets of delay elements 135, where m is an integer greater than one. Each delay element 135 contains two multipliers 135a, 135b, one adder 135c, and a buffer 135d. Since the operating principle of the IIR filter is well-known, we do not describe it further herein.

Figure 5:
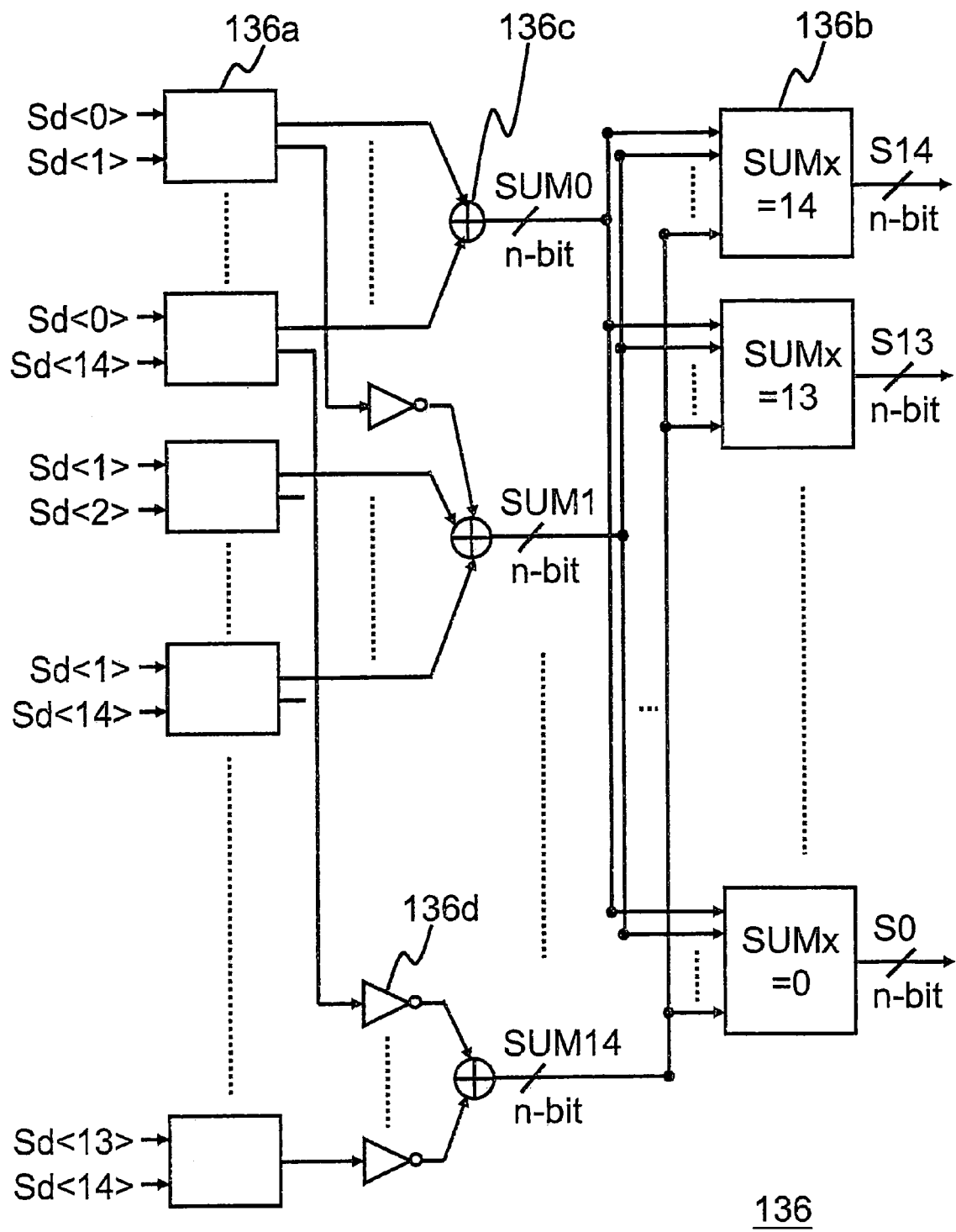
FIG. 5 shows an embodiment of the system structure of the digital sorting circuit in FIG. 3.
Figure 6:
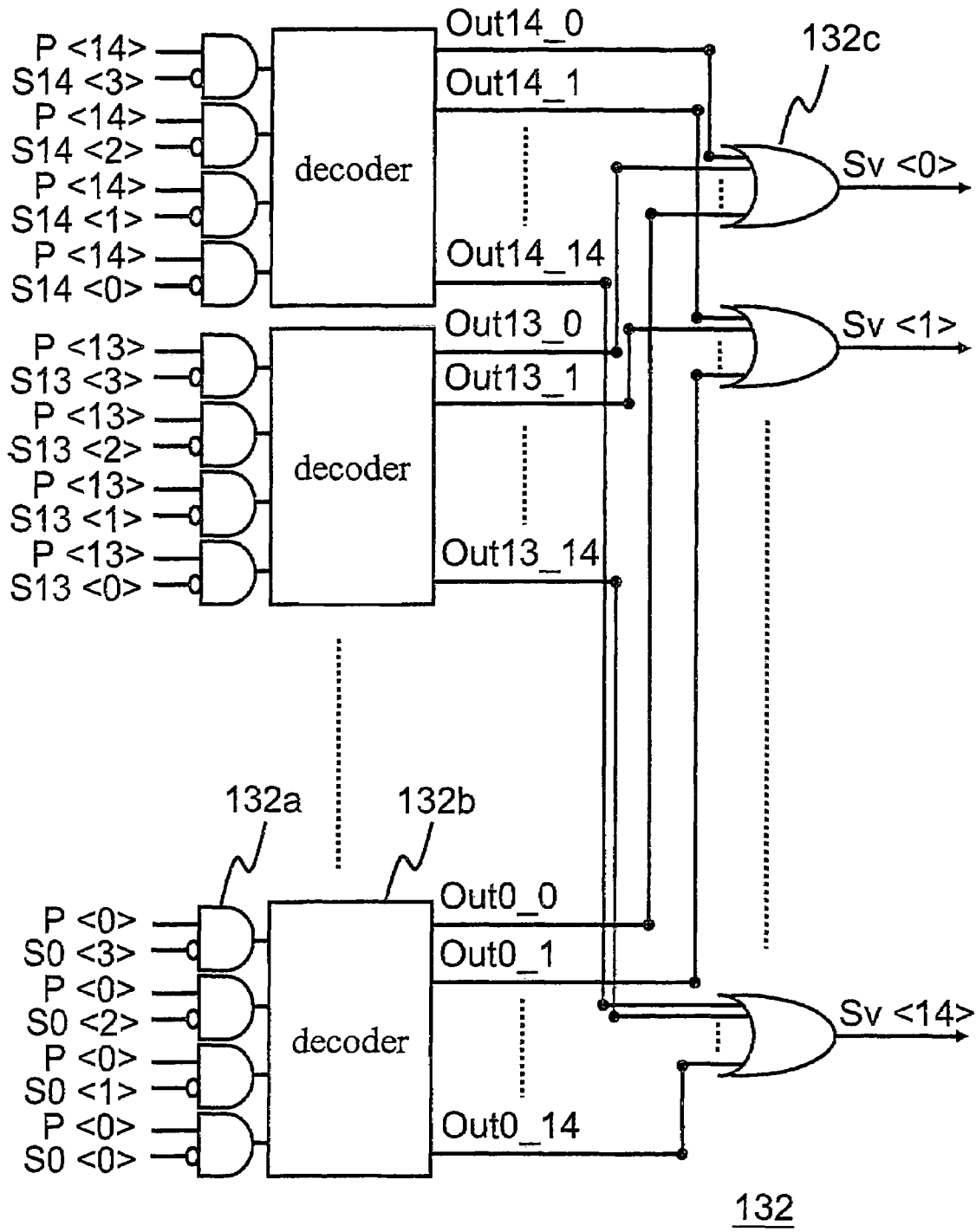
FIG. 6 shows an embodiment of the system structure of the vector quantizer in FIG. 3.

FIGS. 5 and 6 show the system structure in the embodiment of the digital sorting circuit 136 and the vector quantizer 132 in FIG. 3. In this embodiment, we use n=4 and p=15 for illustration purposes. As shown in FIG. 5, the digital sorting circuit 136 contains several comparators 136a, several accumulators 136b, several adders 136c, and several INVERSE gates 136d. In the current embodiment, each comparator 136a compares Sd<x> and Sd<y>, with $0 \leq x, y \leq 14$. When Sd<x> is greater than Sd<y>, the comparator 136a outputs a logic 1 and the comparator 136a outputs a logic 0. Each adder 136c logically adds the outputs of a set of comparators 136a to output a sum SUMx ($0 \leq x \leq 14$). Afterwards, each accumulator 136b receives the sums SUMx and determines which adder outputs a sum SUMx equal to y. Here, the accumulator 136b outputs n-bit signals S0~S14 according to the determination result as the corresponding x, thereby acquiring the third output signal Su.

FIG. 6 is a structural diagram of the vector quantizer 132, which is comprised of several INVERSE AND gates 132a, several decoders 132b, and several OR gates 132c. With simultaneous reference to FIGS. 2, 5, and 6, the adder 138 logically adds the third output signal Su output from the accumulator 136b and the second output signal Sd<p−1:0> output from the filter circuit 134, entering a first sum result S0<3:0>~S14<3:0> (i.e., the feedback signal Sy<p−1:0>) to the INVERSE AND gates 132a. Concurrently, the p-bit digital signal P output from the encoder is transmitted to the INVERSE AND gates 132a. Therefore, each INVERSE AND gate 132 logically adds one bit of the first sum results (S0<0>, S0<1>, S0<2>, S0<3>, . . . , S13<2>, S13<3>, S14<0>, S14<1>, S14<2>, or S14<3>) and one bit of the p-bit digital signal (P<0>, P<1>, . . . , P<13> or P<14>) and provides a second sum result to the decoders 132b. Each decoder 132b receives the second sum results output from four of the INVERSE AND gates 132a, decodes them and outputs the decoded result Outx_0~Outx_14 with $0 \leq x \leq 14$. The decoding method is given in Table 2.

TABLE 2

| Input of Decoder | Output of Decoder |
|---|---|
| 1111 | 100000000000000 |
| 1110 | 010000000000000 |

TABLE 2-continued

| Input of Decoder | Output of Decoder |
|---|---|
| 1101 | 001000000000000 |
| 1100 | 000100000000000 |
| 1011 | 000010000000000 |
| 1010 | 000001000000000 |
| 1001 | 000000100000000 |
| 1000 | 000000010000000 |
| 0111 | 000000001000000 |
| 0110 | 000000000100000 |
| 0101 | 000000000010000 |
| 0100 | 000000000001000 |
| 0011 | 000000000000100 |
| 0010 | 000000000000010 |
| 0001 | 000000000000001 |
| 0000 | 000000000000000 |

Therefore, the OR gates 132 adds up a set of decoding results output from the decoders 132b and outputs several control signals Sv <0>, Sv <1>, . . . , Sv <14>. Out0_0, Out1_0, . . . , Out14_0 are in one set, Out0_1, Out1_1, . . . , Out14_1 are in another set, and so on.

Figure 7:
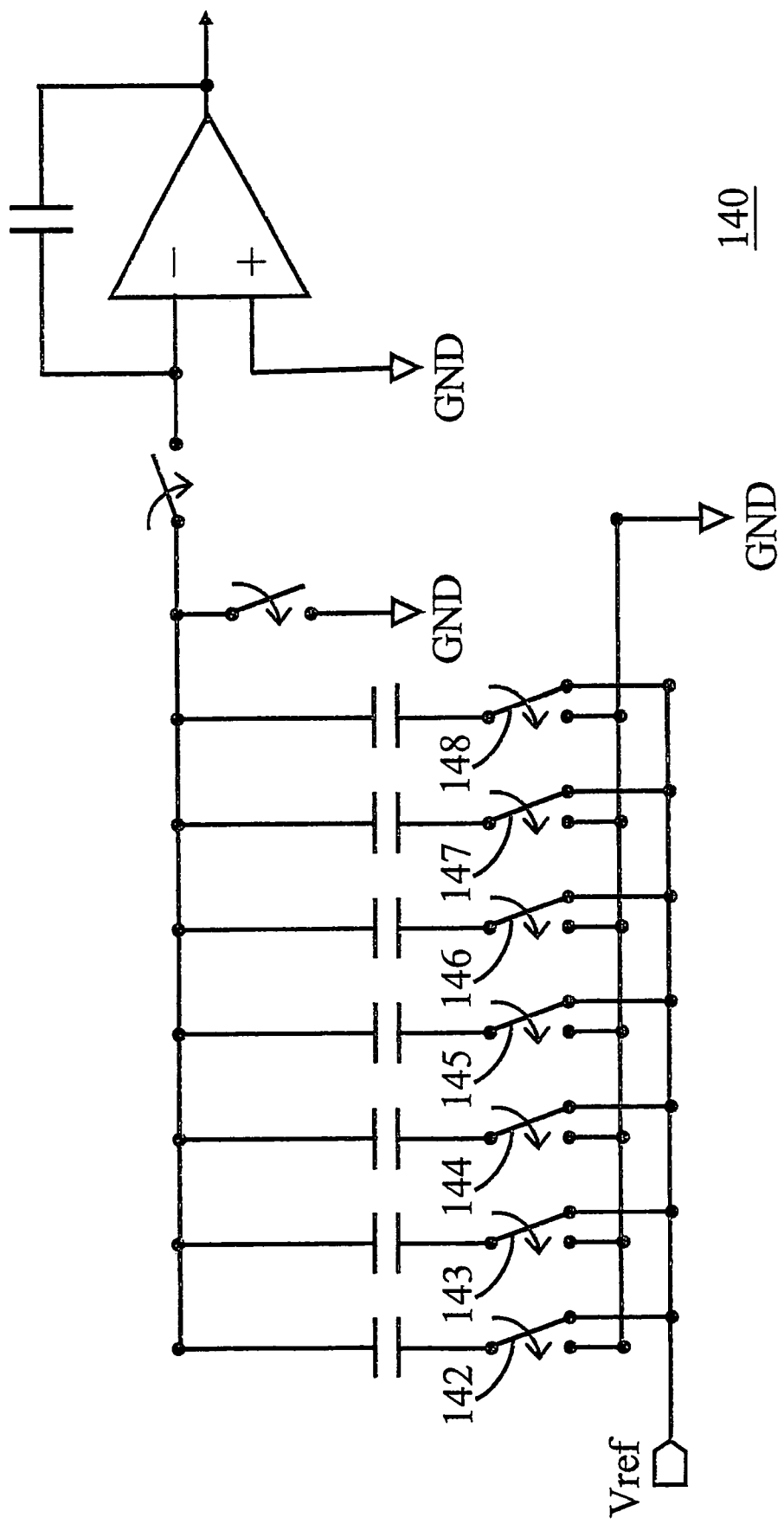
FIG. 7 shows an embodiment of the system structure of the analog-to-digital converting unit in FIG. 1.

The analog-to-digital converting unit 140 can be an internal n-bit DAC, usually implemented using several unit elements such as capacitors, resistors or current switches. With reference to FIG. 7, there are ($2^n$−1) unit elements with n=3 in this embodiment. As shown in the drawing, the switches 142~148 are selectively coupled to a reference level Vref or an analog ground GND according to the control signal Sv, thereby providing an analog signal corresponding to the n-bit quantized digital signal N according to the control signal Sv (step 250). In this embodiment, when the control signal is logic 1, the switch is connected to the reference level Vref; whereas when the control signal is logic 0, the switch is connected to the analog ground GND. Since the structure and operating principle of the n-bit analog-to-digital converter is well-known, we do not describe it further herein.

Finally, the analog signal produced according to the n-bit quantized digital signal N is fed back to the adder 108 for logic addition with the analog signal SA (step 260). This renders an analog signal that is then output to the loop filter 112.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An analog-to-digital converting circuit with a noise shaping function, for generating an n-bit digital signal according to a first analog signal, the analog-to-digital converting circuit comprising:
   an adder for outputting a third analog signal according to the first analog signal and a second analog signal;
   an analog-to-digital converter for converting the third analog signal into the n-bit digital signal;
   an encoder for generating a p-bit digital signal according to the n-bit digital signal;
   a control circuit for generating at least one control signal according to the p-bit digital signal; and
   a digital-to-analog converting unit for generating the second analog signal according to the control signal;
   wherein n is an integer greater than 1 and p is an integer greater than n.

2. The analog-to-digital converting circuit of claim 1, wherein the encoder is a thermal encoder.

3. The analog-to-digital converting circuit of claim 1, wherein the control circuit includes:
- a vector quantizer for generating the control signal; and a feedback circuit for generating a feedback signal to the vector quantizer according to the control signal;
- wherein the vector quantizer generates the control signal according to the p-bit digital signal and the feedback signal.

4. The analog-to-digital converting circuit of claim 3, wherein the feedback circuit includes:
- a first adder for generating a first output signal according to the feedback signal and the control signal;
- a filter circuit for filtering the first output signal to generate the second output signal, where the filter circuit is selected from the group consisting of an infinite impulse response filter and a finite impulse response filter;
- a digital sorting circuit for acquiring a minimum of the second output signal to generate a third output signal; and
- a second adder for generating the feedback signal according to the second and the third output signals.

5. The analog-to-digital converting circuit of claim 1, wherein the analog-to-digital converter is a sigma-delta modulator ($\Sigma$-$\Delta$ modulator).

6. The converting circuit of claim 1, wherein the analog-to-digital converter comprises:
- a loop filter for filtering the third analog signal; and
- an n-bit quantizer for generating the n-bit digital signal according to the filtered third analog signal.

7. The analog-to-digital converting circuit of claim 1, wherein p is equal to two the power of n minus one.

8. An analog-to-digital converting method with a noise shaping function for generating an n-bit digital signal according to a first analog signal and shaping noises, the method comprising the steps of:
- generating the n-bit digital signal according to the first analog signal and a second analog signal;
- coding the n-bit digital signal to generate a p-bit digital signal;
- generating at least one digital control signal according to the p-bit digital signal; and
- generating the second analog signal according to the digital control signal;
- wherein n is an integer greater than 1 and p is an integer greater than n.

9. The method of claim 8, wherein the step of coding the n-bit digital signal to generate a p-bit digital signal comprises the step of generating the p-bit digital signal according to the n-bit digital signal by thermal coding.

10. The method of claim 8, wherein the step of generating at least one digital control signal according to the p-bit digital signal comprises the steps of:
- generating a feedback signal according to the digital control signal; and
- generating the digital control signal according to the p-bit digital signal and the feedback signal.

11. The method of claim 10, wherein the step of generating the second analog signal according to the digital control signal comprises the steps of:
- generating a first output signal according to the digital control signal and the feedback signal;
- filtering the first output signal to generate a second output signal;
- acquiring the minimum of the second output signal to generate a third output signal; and
- generating the feedback signal according to the second output signal and the third output signal.

12. The method of claim 8, wherein the step of generating the n-bit digital signal according to the first analog signal and a second analog signal comprises the steps of:
- generating a third analog signal according to the first and the second analog signals;
- filtering the third analog signal; and generating the n-bit digital signal according to the filtered third analog signal.

13. The method of claim 8, wherein p is equal to two to the power of n minus one.

14. A noise shaping circuit, applied to an analog-to-digital converting circuit, for performing a noise shaping when the analog-to-digital converting circuit generates an n-bit digital signal according to a first analog signal and a second analog signal, the noise shaping circuit comprising:
- an encoder for generating a p-bit digital signal according to the n-bit digital signal, where n and p are integers greater than 1;
- a control circuit for generating at least one control signal according to the p-bit digital signal; and
- an analog-to-digital converting unit for generating the second analog signal according to the control signal.

15. The noise shaping circuit of claim 14, wherein the encoder is a thermal encoder.

16. The noise shaping circuit of claim 14, wherein the control circuit comprises:
- a vector quantizer for generating the control signal; and
- a feedback circuit for generating a feedback signal to the vector quantizer according to the control signal;
- wherein the vector quantizer generates the control signal according to the p-bit digital signal and the feedback signal.

17. The noise shaping circuit of claim 16, wherein the feedback circuit comprises:
- a first adder for generating a first output signal according to the control signal and the feedback signal;
- a filter circuit for filtering the first output signal to generate a second output signal, where the filter circuit is selected from the group consisting of an IIR filter and a FIR filter;
- a digital sorting circuit for acquiring a minimum of the second output signal to generate a third output signal; and
- a second adder for generating the feedback signal according to the second and the third output signals.

18. The noise shaping circuit of claim 14, wherein p is equal to 2 to the power of n minus one.

* * * * *